(12) United States Patent
Lee et al.

(10) Patent No.: US 8,409,782 B2
(45) Date of Patent: Apr. 2, 2013

(54) PHOTORESIST COMPOSITION COMPRISING PHOTOINITIATORS, AND TRANSPARENT THIN FILM AND LIQUID CRYSTAL DISPLAY DEVICE USING THE COMPOSITION

(75) Inventors: Keon Woo Lee, Daejeon (KR); Sung Hyun Kim, Daejeon (KR); Sang Kyu Kwak, Daejeon (KR); Dong Kung Oh, Daejeon (KR); Chang Soon Lee, Daejeon (KR); Chang Ho Cho, Anseong (KR); Kyoung Hoon Min, Daejeon (KR)

(73) Assignee: LG Chem, Ltd, Seoul (KR)

( * ) Notice: Subject to any disclaimer, the term of this patent is extended or adjusted under 35 U.S.C. 154(b) by 274 days.

(21) Appl. No.: 12/674,408

(22) PCT Filed: Jun. 22, 2009

(86) PCT No.: PCT/KR2009/003324
§ 371 (c)(1),
(2), (4) Date: Feb. 19, 2010

(87) PCT Pub. No.: WO2010/002129
PCT Pub. Date: Jan. 7, 2010

(65) Prior Publication Data
US 2011/0287366 A1    Nov. 24, 2011

(30) Foreign Application Priority Data

Jul. 1, 2008 (KR) .......... 10-2008-0063313
Jun. 19, 2009 (KR) .......... 10-2009-0054850

(51) Int. Cl.
G03F 7/00 (2006.01)
G03F 7/004 (2006.01)
G03F 7/027 (2006.01)
G03F 7/028 (2006.01)

(52) U.S. Cl. ............. 430/270.1; 430/286.1; 430/281.1; 430/905; 430/913

(58) Field of Classification Search .............. 430/270.1, 430/913, 905, 281.1, 286.1
See application file for complete search history.

(56) References Cited

U.S. PATENT DOCUMENTS 7,189,489 B2 * 3/2007 Kunimoto et al. ......... 430/270.1
2007/0270522 A1 * 11/2007 Akutsu et al. ............. 522/168

FOREIGN PATENT DOCUMENTS

| JP | 06-123966 A | 5/1994 |
| JP | 11-279403 A | 10/1999 |
| JP | 2005-195758 A | 7/2005 |
| JP | 2006-184841 A | 7/2006 |
| JP | 2008-058979 A | 3/2008 |
| KR | 1020040007700 A | 1/2004 |
| WO | 02/100903 A1 | 12/2002 |
| WO | WO 2006018973 A1 * | 2/2006 |

* cited by examiner

*Primary Examiner* — Amanda C. Walke
(74) *Attorney, Agent, or Firm* — Rothwell, Figg, Ernst & Manbeck, P.C.

(57) ABSTRACT

A photoresist composition is provided. The photoresist composition comprises two or more kinds of photoinitiators having different activation wavelengths whose difference is at least 20 nm. The photoresist composition has high sensitivity and forms a pattern whose thickness is easy to control depending on the exposure intensity through a slit or transflective mask. Further provided are a transparent thin film formed using the photoresist composition and a liquid crystal display device comprising the thin film.

14 Claims, 1 Drawing Sheet

PHOTORESIST COMPOSITION COMPRISING PHOTOINITIATORS, AND TRANSPARENT THIN FILM AND LIQUID CRYSTAL DISPLAY DEVICE USING THE COMPOSITION

CROSS REFERENCE TO RELATED APPLICATIONS

This application is a 35 U.S.C. §371 National Phase Entry Application from PCT/KR2009/003324, filed Jun. 22, 2009, and designating the United States, which claims priority under 35 U.S.C. §119 to Korean Patent Application No. 10-2008-0063313 filed Jul. 1, 2008 and to Korean Patent Application No. 10-2009-0054850 filed Jun. 19, 2009, each identified application being incorporated herein in their entireties.

TECHNICAL FIELD

The present invention relates to a photoresist composition that uses two or more kinds of photoinitiators having different activation wavelengths to form a pattern whose thickness is easy to control depending on the exposure intensity while achieving high sensitivity. The present invention also relates to a transparent thin film formed using the photoresist composition, and a liquid crystal display device comprising the thin film.

BACKGROUND ART

A liquid crystal cell of a liquid crystal display device essentially consists of a thin film transistor (TFT) substrate for driving the liquid crystal display device, a color filter for color display, and a liquid crystal layer between the two substrates. The color filter is produced by subjecting a photosensitive organic material, in which at least one pigment is dispersed, to photolithography to form a pattern and coating three or more kinds of color inks having different transmission-absorption wavelengths on the pattern to form pixels. The pixels are combined to create color images. If needed, overcoats are formed on the pixels of the color filter substrate to reduce the step height between the adjacent pixels, or column spacers are formed by patterning to maintain an inner gap of the liquid crystal cell at a constant level.

Photoresist compositions, particularly, negative type compositions patternable by photolithography are generally used to form the overcoats or the column spacers. A typical negative type photoresist composition is a mixture composed essentially of an alkali-soluble polymer, a polyfunctional monomer containing two or more acrylate groups, and a photoinitiator. If necessary, the negative type photoresist composition may further comprise a solvent and one or more additives selected from surfactants, adhesion aids, etc. The photoinitiator is decomposed to generate active radicals when the negative type photoresist composition is exposed to light, particularly UV. The active radicals activate the acrylate groups of the polyfunctional monomer to induce crosslinking of the alkali-soluble polymer with the polyfunctional monomer (photopolymerization). This photopolymerization increases the molecular weight of the polymer in the crosslinked portion (i.e. in the portion exposed to light), and as a result, the exposed portion becomes insoluble in an alkaline solution. The exposed portion remains unremoved after subsequent development. Consequently, the use of the negative type photosensitive resin enables the formation of a fine pattern by photolithography. The sensitivity of the photoresist composition is associated with the minimum exposure dose (i.e. light energy) at which the pattern is stably formed. A low exposure dose shortens the processing time, contributing to the improvement in productivity. Particularly, the sensitivity of a photoresist composition for forming column spacers is determined by an exposure dose at which the variation in the thickness of a pattern is sharply decreased.

Photoinitiators that rapidly respond to low light energy have been used to improve the sensitivity of photoresist compositions without any marked reduction in the developability of the photoresist compositions. However, the use of photoinitiators is disadvantageous in that the variation in the thickness of patterns depending on the exposure dose is small. This disadvantage makes it difficult to form transparent thin films whose thickness is controlled by varying the slit structure and transmittance of photomasks.

DISCLOSURE

Technical Problem

The present invention has been made in an effort to solve the problems of transparent thin films formed using conventional photoresist compositions, and it is an object of the present invention to provide a photoresist composition that has high sensitivity and forms a pattern whose thickness is easy to control depending on the exposure intensity through a slit or transflective mask.

It is another object of the present invention to provide a transparent thin film formed using the photoresist composition.

It is still another object of the present invention to provide a liquid crystal display device comprising the transparent thin film.

Technical Solution

According to the present invention, there is provided a photoresist composition that uses two or more kinds of photoinitiators having different activation wavelengths whose difference is least 20 nm to form a pattern whose thickness is easy to control depending on the exposure intensity while achieving high sensitivity, thus being suitable for use in the formation of a transparent thin film of a liquid crystal display device.

Advantageous Effects

The photoresist composition of the present invention has high sensitivity and forms a pattern whose thickness is easy to control depending on the exposure intensity through a slit or transflective mask. Therefore, the use of the photoresist composition according to the present invention is advantageous for the formation of column spacers, overcoats and passivation materials of liquid crystal display devices.

BEST MODE

Figure 1:
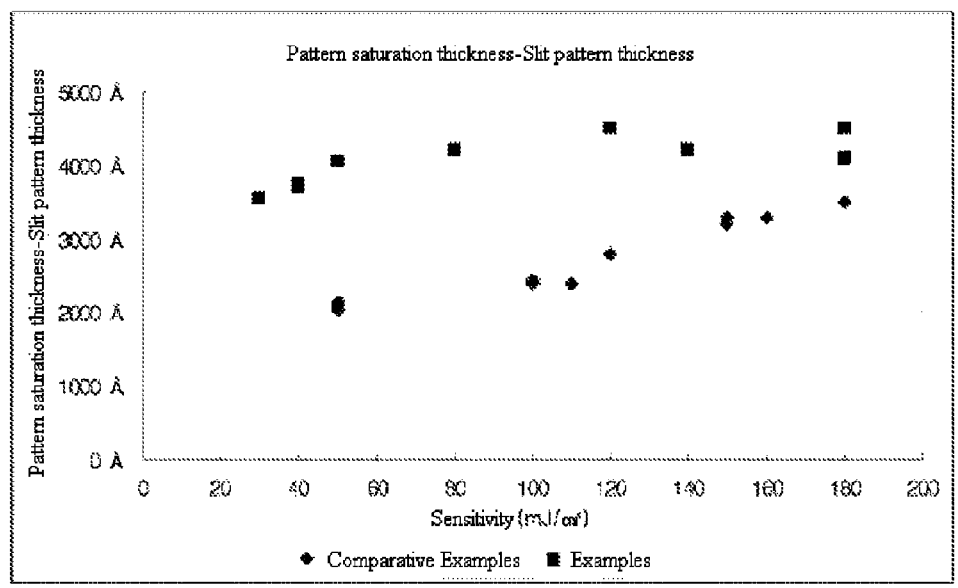
FIG. 1 is a graph illustrating the correlation between the sensitivity of a photoresist composition prepared in each of Examples 1-12 and Comparative Examples 1-20 and the difference in thickness between a pattern formed using the photoresist composition through a photomask having a transmittance of 100% (hereinafter referred to simply as a 'pattern saturation thickness') and a pattern formed using the photoresist composition through a slit photomask (hereinafter referred to simply as a 'slit pattern thickness')

The present invention provides a photoresist composition comprising two or more kinds of photoinitiators having different activation wavelengths whose difference is at least 20 nm.

Specifically, the photoresist composition of the present invention comprises two or more photoinitiators, an alkali-soluble resin, an ethylenically unsaturated compound, and a solvent. More specifically, the photoresist composition of the present invention comprises 1 to 20% by weight of the alkali-soluble resin, 1 to 20% by weight of the ethylenically unsaturated compound, 0.05 to 10% by weight of the photoinitiators, and 50 to 90% by weight of the solvent.

The photoinitiators of the photoresist composition according to the present invention are characterized by having different activation wavelengths whose difference is at least 20 nm. In an embodiment, the photoinitiators may be Irgacure 369 (Ciba Geigy) having an activation wavelength of 325 nm and a hexaaryl bisimidazole having an activation wavelength of 270 nm. In an alternative embodiment, the photoinitiators may be Irgacure OXE-02 (Ciba Geigy) having an activation wavelength of 333 nm and Irgacure 907 (Ciba Geigy) having an activation wavelength of 305 nm. Any known set of photoinitiators may be used without limitation so long as the difference in activation wavelength between the photoinitiators is at least 20 nm.

Other examples of the photoinitiators may be a combination of Irgacure 250 (Ciba Geigy) having an activation wavelength of 250 nm and Irgacure 819 (Ciba Geigy) having an activation wavelength of 370 nm, a combination of Irgacure 369 (Ciba Geigy) having an activation wavelength of 325 nm and Irgacure 907 (Ciba Geigy) having an activation wavelength of 305 nm, a combination of Irgacure 369 (Ciba Geigy) having an activation wavelength of 325 nm and Irgacure 819 (Ciba Geigy) having an activation wavelength of 370 nm, a combination of a hexaaryl bisimidazole having an activation wavelength of 270 nm and Irgacure OXE-02 (Ciba Geigy) having an activation wavelength of 333 nm, and a combination of Irgacure OXE-02 (Ciba Geigy) having an activation wavelength of 333 nm and Irgacure 819 (Ciba Geigy) having an activation wavelength of 370 nm.

Each of the photoinitiators has an activation wavelength ranging from 250 nm to 450 nm. This activation wavelength range is preferred in that the photoinitiators can effectively utilize the wavelengths of light sources generally used in the art, such as mercury vapor arc, carbon arc, xenon arc and halogen arc.

The difference in activation wavelength between the photoinitiators is preferably from 20 to 100 nm and more preferably from 20 to 70 nm. If the activation wavelength difference is smaller than 20 nm, the difference between the pattern saturation thickness and the slit pattern thickness or the difference between the pattern saturation thickness and the transflective pattern thickness, which is a factor determining the effects of the present invention, is not sufficiently large. Meanwhile, if the activation wavelength difference is larger than 100 nm, the utilization of a light source may be inefficient.

The photoinitiators are preferably used in an amount of 0.05 to 10% by weight, based on the total weight of the photoresist composition. The use of the photoinitiators in an amount of less than 0.05% by weight results in insufficient photoactivity, which may make it impossible to form a uniform pattern. Meanwhile, the use of the photoinitiators in an amount of more than 10% by weight may increase the possibility of excessive dissolution of the photoresist composition.

There is no limitation on the number of the photoinitiators. For example, two photoinitiators may be used in the photoresist composition of the present invention. In this case, the ratio between the two photoinitiators is in the range of 1:3 to 3:1. Outside this range, it is difficult to obtain desired effects of the present invention and the characteristics of the photoinitiator in a relatively large amount become predominant.

The alkali-soluble resin of the photoresist composition according to the present invention is a polymer resin that contains carboxylic acid groups and is soluble in an alkaline solution. The alkali-soluble resin does not require any particular structure. For example, the alkali-soluble resin may be a copolymer of polymethacrylate as a main component and methacrylic acid or may have a structure in which polyamic acid is included in polymethacrylate as a main component. The content of the alkali-soluble resin is preferably from 1 to 20% by weight, based on the total weight of the photoresist composition. If the content of the alkali-soluble resin is less than 1% by weight, it is difficult to form a pattern because the photoresist composition is not sufficiently dissolved in a developing solution. Meanwhile, if the content of the alkali-soluble resin exceeds 20% by weight, the photoresist composition in the form of a solution is too viscous, making it difficult to coat.

Any known ethylenically unsaturated compound may be used in the photoresist composition of the present invention so long as the objects of the present invention are not impaired. Representative examples of such ethylenically unsaturated compounds include the compounds of Formulas 1 to 4:

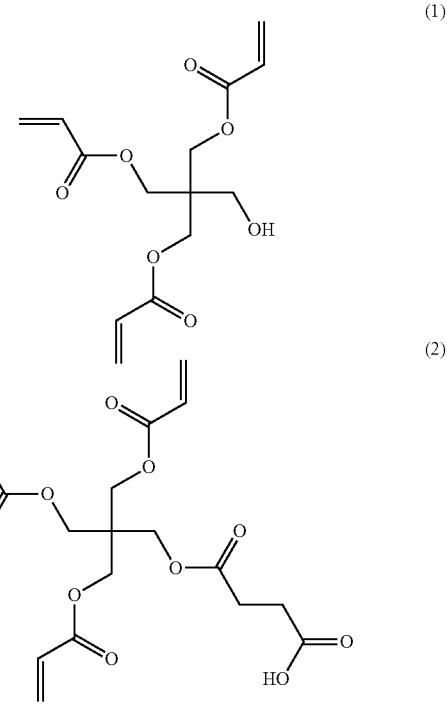

-continued

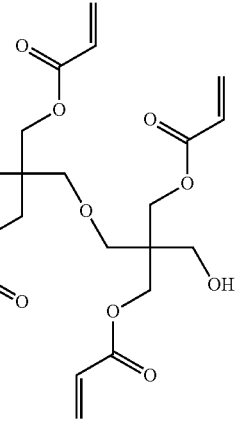

(3)

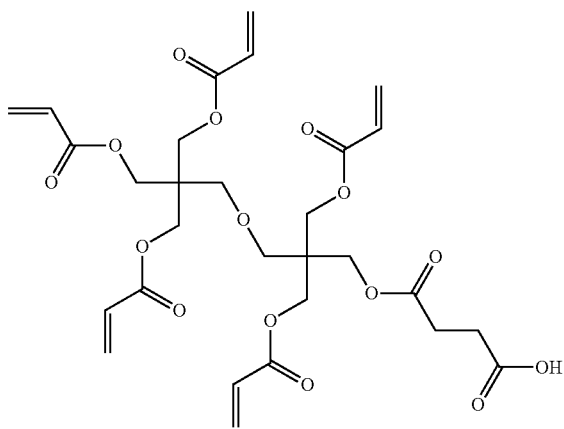

(4)

The weight ratio of the ethylenically unsaturated compound to the alkali-soluble resin is preferably from 0.7:1 to 3:1. If the weight of the ethylenically unsaturated compound is less than the lower limit, it is difficult to expect sufficient polymerization effects. Meanwhile, if the weight of the ethylenically unsaturated compound is more than the upper limit, it is difficult to form a thin film due to a relatively small amount of the polymer resin.

The ethylenically unsaturated compound is preferably used in an amount of 1 to 20% by weight, based on the total weight of the photoresist composition. The use of the ethylenically unsaturated compound in an amount of less than 1% by weight does not ensure satisfactory crosslinking with the alkali-soluble resin. Meanwhile, the use of the ethylenically unsaturated compound in an amount exceeding 20% by weight makes the photoresist composition less soluble in an alkaline solution, which causes difficulty in forming a pattern.

Ethylenically unsaturated compounds other than the ethylenically unsaturated compounds of Formulas 1 to 4 may be used in the photoresist composition of the present invention. Specific examples of such ethylenically unsaturated compounds include: compounds introduced into dipentaerythritol, such as KAYARAD DPCA-20, KAYARAD DPCA-30, KAYARAD DPCA-60 and KAYARAD DPCA-120; compounds introduced into tetrahydrofurfuryl acrylate, such as KAYARAD TC-110S; and compounds introduced into neopentyl glycol hydroxypivalate, such as KAYARAD HX-220 and KAYARAD HK-620. The ethylenically unsaturated compound may be a functional monomer having one or more ethylenically unsaturated bonds. Examples of such functional monomers include epoxy acrylates of bisphenol A derivatives, novolac-epoxy acrylates, and urethane-based polyfunctional acrylates, such as U-324A, U15HA and U-4HA. These functional monomers may be used alone or as a mixture of two or more thereof.

The solvent may be selected from the group consisting of, but not limited to, methylethylketone, methyl cellosolve, propyl cellosolve, ethyl cellosolve, ethyleneglycol dimethylether, ethyleneglycol diethylether, ethyleneglycol methylethylether, propyleneglycol dimethylether, propyleneglycol diethylether, propyleneglycol methylethylether, 2-ethoxy propanol, 2-methoxy propanol, 3-methoxy butanol, cyclopentanone, cyclohexanone, propyleneglycol methyletheracetate, propyleneglycol ethyletheracetate, 3-methoxybutyl acetate, ethyl 3-ethoxypropionate, ethyl cellosolve acetate, methyl cellosolve acetate, butyl acetate, dipropyleneglycol monomethylether, and mixtures thereof. The solvent may be any suitable solvent known in the art.

Optionally, the photoresist composition of the present invention may further comprise at least one additive selected from curing accelerators, thermal polymerization inhibitors, plasticizers, adhesion promoters, fillers, and surfactants.

The curing accelerators may be those known in the art, for example, 2-mercaptobenzoimidazole, 2-mercaptobenzothiazole, 2-mercaptobenzooxazole, 2,5-dimercapto-1,3,4-thiadiazole and 2-mercapto-4,6-dimethylaminopyridine, but are not necessarily limited thereto.

The thermal polymerization inhibitors may be those known in the art, for example, p-anisole and hydroquinone, but are not necessarily limited thereto.

The plasticizers, adhesion promoters, fillers and surfactants may be those that are used in conventional photoresist compositions.

The photoresist composition of the present invention can be applied to a suitable substrate by any suitable process, such as roll coating, curtain coating, spin coating, slot die coating, printing or dipping. The substrate may be a metal, paper, glass or plastic substrate. The coating on the substrate may be directly transferred to another substrate. Alternatively, the coating on the substrate may be indirectly transferred to another substrate via a blanket. There is no particular limitation on the application method of the photoresist composition.

The photoresist composition of the present invention can be cured under a suitable light source known in the art, for example, a mercury vapor, carbon, xenon or halogen arc that emits light having a wavelength of 250 to 450 nm. There is no particular limitation on the kind of the light source.

The photoresist composition of the present invention can be used in various applications, for example, photocurable paints, photocurable inks, transparent photoresist compositions for the production of LCD color filters, pigment-dispersion type photoresist compositions, and photoresist compositions for the formation of light blocking films of organic light emitting diodes. However, there is no particular limitation on the application of the photoresist composition according to the present invention.

The present invention also provides a transparent thin film for a liquid crystal display device that is formed using the photoresist composition. The transparent thin film can be formed by any suitable method known in the art except that the photoresist composition of the present invention is used.

The present invention also provides a liquid crystal display device comprising the transparent thin film. The liquid crystal display device can be fabricated by any suitable method known in the art except that the transparent thin film of the present invention is used.

Mode for Invention

Hereinafter, the present invention will be explained in more detail with reference to the following examples. However, these examples are given for illustrative purposes only and are not intended to limit the scope of the present invention.

EXAMPLES

Example 1

8 parts by weight of benzyl methacrylate/methacrylate (BzMA/MAA, molar ratio: 70/30, Mw: 24,000) as an alkali-soluble resin, 16 parts by weight of dipentaerythritol hexaacrylate as an ethylenically unsaturated compound, 1 part by weight of 2-benzyl-2-dimethylamino-1-(4-morpholinophenyl)-butan-1-one (Irgacure 369, Ciba Geigy) as a photoinitiator, 1 part by weight of a hexaaryl bisimidazole (Aldrich) as another photoinitiator, and 79 parts by weight of PGMEA as an organic solvent were mixed in a shaker for 3 hours. The mixture was filtered through a 5 micron filter to obtain a photoresist composition. The photoresist composition was applied to glass by spin coating, and prebaked at 100° C. for 2 min to form uniform films, each having a thickness of about 3.0 μm. The films were exposed to a high-pressure mercury lamp with varying exposure doses from 10 to 500 mJ/cm$^2$ through three different patterned photomasks to form patterns. The photomasks were a first photomask having a circular isolated pattern (transmittance: 100%, diameter: 15 μm), a second photomask having a circular isolated pattern (diameter: 15 μm) whose transmittance was adjusted to 10% using a chromium-deposited thin film, and a third photomask having a circular isolated pattern (diameter: 15 μm) whose transmittance was adjusted to 10% by controlling the opening ratio using a slit pattern. The patterns were developed with an alkaline aqueous KOH solution (pH 11.3-11.7), washed with deionized water, and post-baked at 200° C. for about 50 min to form spacer patterns.

The thickness of each of the patterns was measured. The sensitivity of the photoresist composition was defined as the exposure dose at which the thickness of the pattern was not increased any further. A low exposure dose means that the pattern was stably formed at low light energy, which is considered an excellent sensitivity characteristic. The difference in thickness between the pattern formed using the first photomask and the pattern formed using the second photomask, and the difference in thickness between the pattern formed using the first photomask and the pattern formed using the third photomask were measured at the same exposure dose as the sensitivity.

Example 2

Spacer patterns were formed in the same manner as in Example 1, except that 1.5 parts by weight of 2-benzyl-2-dimethylamino-1-(4-morpholinophenyl)-butan-1-one (Irgacure 369, Ciba Geigy) and 1.5 parts by weight of a hexaaryl bisimidazole (Aldrich) were used as photoinitiators.

Example 3

Spacer patterns were formed in the same manner as in Example 1, except that 1 part by weight of 2-benzyl-2-dimethylamino-1-(4-morpholinophenyl)-butan-1-one (Irgacure 369, Ciba Geigy) and 1 part by weight of 2-methyl-1-[4-(methylthio)phenyl]-2-morpholinopropan-1-one (Irgacure 907, Ciba Geigy) were used as photoinitiators.

Example 4

Spacer patterns were formed in the same manner as in Example 1, except that 1.5 parts by weight of 2-benzyl-2-dimethylamino-1-(4-morpholinophenyl)-butan-1-one (Irgacure 369, Ciba Geigy) and 1.5 parts by weight of 2-methyl-1-[4-(methylthio)phenyl]-2-morpholinopropan-1-one (Irgacure 907, Ciba Geigy) were used as photoinitiators.

Example 5

Spacer patterns were formed in the same manner as in Example 1, except that 1 part by weight of 2-benzyl-2-dimethylamino-1-(4-morpholinophenyl)-butan-1-one (Irgacure 369, Ciba Geigy) and 1 part by weight of bis(2,4,6-trimethylbenzoyl)-phenylphosphineoxide (Irgacure 819, Ciba Geigy) were used as photoinitiators.

Example 6

Spacer patterns were formed in the same manner as in Example 1, except that 1.5 parts by weight of 2-benzyl-2-dimethylamino-1-(4-morpholinophenyl)-butan-1-one (Irgacure 369, Ciba Geigy) and 1.5 parts by weight of bis(2,4,6-trimethylbenzoyl)-phenylphosphineoxide (Irgacure 819, Ciba Geigy) were used as photoinitiators.

Example 7

Spacer patterns were formed in the same manner as in Example 1, except that 1 part by weight of 1-[9-ethyl-6-(2-methylbenzyl)-9H-carbazol-3-yl]ethanone-1-(O-acetyloxime) (Irgacure OXE-02, Ciba Geigy) and 1 part by weight of a hexaaryl bisimidazole (Aldrich) were used as photoinitiators.

Example 8

Spacer patterns were formed in the same manner as in Example 1, except that 1.5 parts by weight of 1-[9-ethyl-6-(2-methylbenzyl)-9H-carbazol-3-yl]ethanone-1-(O-acetyloxime) (Irgacure OXE-02, Ciba Geigy) and 1.5 parts by weight of a hexaaryl bisimidazole (Aldrich) were used as photoinitiators.

Example 9

Spacer patterns were formed in the same manner as in Example 1, except that 1 part by weight of 1-[9-ethyl-6-(2-methylbenzyl)-9H-carbazol-3-yl]ethanone-1-(O-acetyloxime) (Irgacure OXE-02, Ciba Geigy) and 1 part by weight of 2-methyl-1-[4-(methylthio)phenyl]-2-morpholinopropan-1-one (Irgacure 907, Ciba Geigy) were used as photoinitiators.

Example 10

Spacer patterns were formed in the same manner as in Example 1, except that 1.5 parts by weight of 1-[9-ethyl-6-(2-methylbenzyl)-9H-carbazol-3-yl]ethanone-1-(O-acetyloxime) (Irgacure OXE-02, Ciba Geigy) and 1.5 parts by weight of 2-methyl-1-[4-(methylthio)phenyl]-2-morpholinopropan-1-one (Irgacure 907, Ciba Geigy) were used as photoinitiators.

Example 11

Spacer patterns were formed in the same manner as in Example 1, except that 1 part by weight of 1-[9-ethyl-6-(2-methylbenzyl)-9H-carbazol-3-yl]ethanone-1-(O-acetyloxime) (Irgacure OXE-02, Ciba Geigy) and 1 part by weight of bis(2,4,6-trimethylbenzoyl)-phenylphosphineoxide (Irgacure 819, Ciba Geigy) were used as photoinitiators.

Example 12

Spacer patterns were formed in the same manner as in Example 1, except that 1.5 parts by weight of 1-[9-ethyl-6-(2-methylbenzyl)-9H-carbazol-3-yl]ethanone-1-(O-acetyloxime) (Irgacure OXE-02, Ciba Geigy) and 1.5 parts by weight of 2-methyl-1-[4-(methylthio)phenyl]bis(2,4,6-trimethylbenzoyl)-phenylphosphineoxide (Irgacure 819, Ciba Geigy) were used as photoinitiators.

Comparative Example 1

Spacer patterns were formed in the same manner as in Example 1, except that 1 part by weight of 2-benzyl-2-dimethylamino-1-(4-morpholinophenyl)-butan-1-one (Irgacure 369, Ciba Geigy) was used as a photoinitiator.

Comparative Example 2

Spacer patterns were formed in the same manner as in Example 1, except that 1.5 parts by weight of 2-benzyl-2-dimethylamino-1-(4-morpholinophenyl)-butan-1-one (Irgacure 369, Ciba Geigy) was used as a photoinitiator.

Comparative Example 3

Spacer patterns were formed in the same manner as in Example 1, except that 1 part by weight of 2-benzyl-2-dimethylamino-1-(4-morpholinophenyl)-butan-1-one (Irgacure 369, Ciba Geigy) and 1 part by weight of 2-dimethylamino-2-(4-methylbenzyl)-1-(4-morpholin-4-yl-phenyl)-butan-1-one (Irgacure 379, Ciba Geigy) were used as photoinitiators.

Comparative Example 4

Spacer patterns were formed in the same manner as in Example 1, except that 1.5 parts by weight of 2-benzyl-2-dimethylamino-1-(4-morpholinophenyl)-butan-1-one (Irgacure 369, Ciba Geigy) and 1.5 parts by weight of 2-dimethylamino-2-(4-methylbenzyl)-1-(4-morpholin-4-yl-phenyl)-butan-1-one (Irgacure 379, Ciba Geigy) were used as photoinitiators.

Comparative Example 5

Spacer patterns were formed in the same manner as in Example 1, except that 1 part by weight of 2-benzyl-2-dimethylamino-1-(4-morpholinophenyl)-butan-1-one (Irgacure 369, Ciba Geigy) and 1 part by weight of α,α-dimethoxy-α-phenylacetophenone (Irgacure 651, Ciba Geigy) were used as photoinitiators.

Comparative Example 6

Spacer patterns were formed in the same manner as in Example 1, except that 1.5 parts by weight of 2-benzyl-2-dimethylamino-1-(4-morpholinophenyl)-butan-1-one (Irgacure 369, Ciba Geigy) and 1.5 parts by weight of α,α-dimethoxy-α-phenylacetophenone (Irgacure 651, Ciba Geigy) were used as photoinitiators.

Comparative Example 7

Spacer patterns were formed in the same manner as in Example 1, except that 1 part by weight of a hexaaryl bisimidazole (Aldrich) was used as a photoinitiator.

Comparative Example 8

Spacer patterns were formed in the same manner as in Example 1, except that 1.5 parts by weight of a hexaaryl bisimidazole (Aldrich) was used as a photoinitiator.

Comparative Example 9

Spacer patterns were formed in the same manner as in Example 1, except that 1 part by weight of 2-methyl-1-[4-(methylthio)phenyl]-2-morpholinopropan-1-one (Irgacure 907, Ciba Geigy) was used as a photoinitiator.

Comparative Example 10

Spacer patterns were formed in the same manner as in Example 1, except that 1.5 parts by weight of 2-methyl-1-[4-(methylthio)phenyl]-2-morpholinopropan-1-one (Irgacure 907, Ciba Geigy) was used as a photoinitiator.

Comparative Example 11

Spacer patterns were formed in the same manner as in Example 1, except that 1 part by weight of 2-methyl-1-[4-(methylthio)phenyl]bis(2,4,6-trimethylbenzoyl)-phenylphosphineoxide (Irgacure 819, Ciba Geigy) was used as a photoinitiator.

Comparative Example 12

Spacer patterns were formed in the same manner as in Example 1, except that 1.5 parts by weight of 2-methyl-1-[4-(methylthio)phenyl]bis(2,4,6-trimethylbenzoyl)-phenylphosphineoxide (Irgacure 819, Ciba Geigy) was used as a photoinitiator.

Comparative Example 13

Spacer patterns were formed in the same manner as in Example 1, except that 1 part by weight of 1-[9-ethyl-6-(2-methylbenzyl)-9H-carbazol-3-yl]ethanone-1-(O-acetyloxime) (Irgacure OXE-02, Ciba Geigy) was used as a photoinitiator.

Comparative Example 14

Spacer patterns were formed in the same manner as in Example 1, except that 1.5 parts by weight of 1-[9-ethyl-6-(2-methylbenzyl)-9H-carbazol-3-yl]ethanone-1-(O-acetyloxime) (Irgacure OXE-02, Ciba Geigy) was used as a photoinitiator.

Comparative Example 15

Spacer patterns were formed in the same manner as in Example 1, except that 1 part by weight of 1-[9-ethyl-6-(2-methylbenzyl)-9H-carbazol-3-yl]ethanone-1-(O-acetyloxime) (Irgacure OXE-02, Ciba Geigy) and 1 part by weight of 2-benzyl-2-dimethylamino-1-(4-morpholinophenyl)-butan-1-one (Irgacure 369, Ciba Geigy) were used as photoinitiators.

Comparative Example 16

Spacer patterns were formed in the same manner as in Example 1, except that 1.5 parts by weight of 1-[9-ethyl-6-(2-methylbenzyl)-9H-carbazol-3-yl]ethanone-1-(O-acetyloxime) (Irgacure OXE-02, Ciba Geigy) and 1.5 parts by weight of 2-benzyl-2-dimethylamino-1-(4-morpholinophenyl)-butan-1-one (Irgacure 369, Ciba Geigy) were used as photoinitiators.

Comparative Example 17

Spacer patterns were formed in the same manner as in Example 1, except that 1 part by weight of 1-[9-ethyl-6-(2-methylbenzyl)-9H-carbazol-3-yl]ethanone-1-(O-acetyloxime) (Irgacure OXE-02, Ciba Geigy) and 1 part by weight of 2-dimethylamino-2-(4-methylbenzyl)-1-(4-morpholin-4-yl-phenyl)-butan-1-one (Irgacure 379, Ciba Geigy) were used as photoinitiators.

Comparative Example 18

Spacer patterns were formed in the same manner as in Example 1, except that 1.5 parts by weight of 1-[9-ethyl-6-(2-methylbenzyl)-9H-carbazol-3-yl]ethanone-1-(O-acetyloxime) (Irgacure OXE-02, Ciba Geigy) and 1.5 parts by weight of 2-dimethylamino-2-(4-methylbenzyl)-1-(4-morpholin-4-yl-phenyl)-butan-1-one (Irgacure 379, Ciba Geigy) were used as photoinitiators.

Comparative Example 19

Spacer patterns were formed in the same manner as in Example 1, except that 1 part by weight of 1-[9-ethyl-6-(2-methylbenzyl)-9H-carbazol-3-yl]ethanone-1-(O-acetyloxime) (Irgacure OXE-02, Ciba Geigy) and 1 part by weight of α,α-dimethoxy-α-phenylacetophenone (Irgacure 651, Ciba Geigy) were used as photoinitiators.

Comparative Example 20

Spacer patterns were formed in the same manner as in Example 1, except that 1.5 parts by weight of 1-[9-ethyl-6-(2-methylbenzyl)-9H-carbazol-3-yl]ethanone-1-(O-acetyloxime) (Irgacure OXE-02, Ciba Geigy) and 1.5 parts by weight of α,α-dimethoxy-α-phenylacetophenone (Irgacure 651, Ciba Geigy) were used as photoinitiators.

Figure 2:
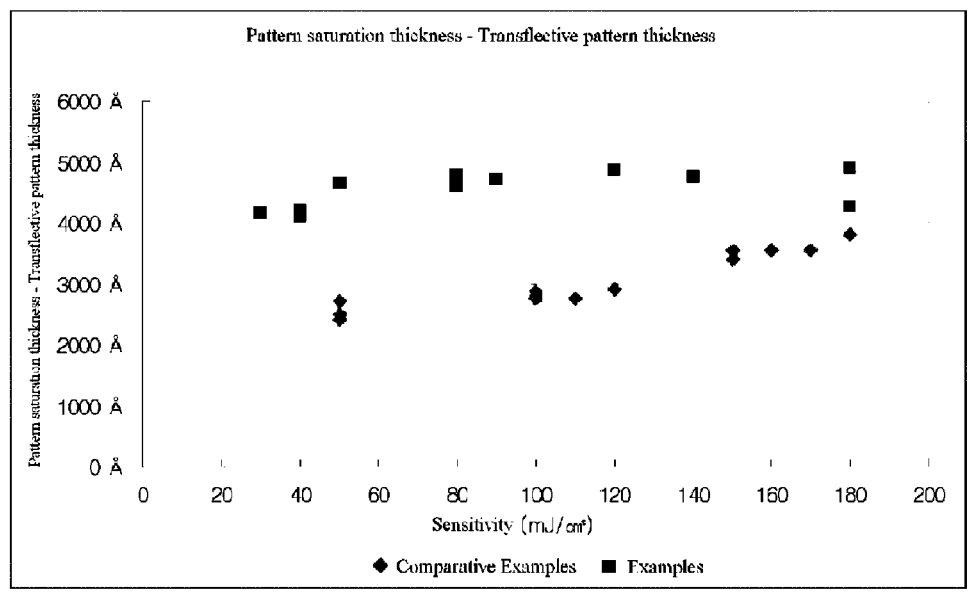
FIG. 2 is a graph illustrating the correlation between the sensitivity of a photoresist composition prepared in each of Examples 1-12 and Comparative Examples 1-20 and the difference between the pattern saturation thickness of the photoresist composition and the thickness of a pattern formed using the photoresist composition through a transflective photomask (hereinafter referred to simply as a 'transflective pattern thickness').

The results obtained in Examples 1-12 and Comparative Examples 1-20 are shown in Table 1 and FIGS. 1 and 2.

TABLE 1

| Content (weight part) | Photoinitiator(s) | | | | Results | | |
|---|---|---|---|---|---|---|---|
| | Activation wavelength | Amount | Activation wavelength | Amount | Sensitivity (mJ/cm$^2$) | $a^*$-$b^{}$ | a-c$^{*}$ |
| Comparative Example 1 | Irgacure 369 (325 nm) | 1.0 | | | 250 | Slit pattern lost | Transflective pattern lost |
| Comparative Example 2 | | 1.5 | | | 180 | 3,500 Å | 3,800 Å |
| Comparative Example 3 | | 1.0 | Irgacure 379 (326 nm) | 1.0 | 160 | 3,300 Å | 3,550 Å |
| Comparative Example 4 | | 1.5 | | 1.5 | 150 | 3,200 Å | 3,400 Å |
| Comparative Example 5 | | 1.0 | Irgacure 651 (340 nm) | 1.0 | 240 | Slit pattern lost | Transflective pattern lost |
| Comparative Example 6 | | 1.5 | | 1.5 | 170 | 3,400 Å | 3,550 Å |
| Comparative Example 7 | | | Hexaaryl bisimidazole (270 nm) | 1.0 | 400 | Slit pattern lost | Transflective pattern lost |
| Comparative Example 8 | | | | 1.5 | 380 | Slit pattern lost | Transflective pattern lost |
| Example 1 | Irgacure 369 (325 nm) | 1.0 | Hexaaryl bisimidazole (270 nm) | 1.0 | 180 | 4,500 Å | 4,900 Å |
| Example 2 | | 1.5 | | 1.5 | 140 | 4,200 Å | 4,750 Å |
| Comparative Example 9 | | | Irgacure 907 (305 nm) | 1.0 | 150 | 3,300 Å | 3,550 Å |
| Comparative Example 10 | | | | 1.5 | 120 | 2,800 Å | 2,900 Å |
| Example 3 | Irgacure 369 (325 nm) | 1.0 | | 1.0 | 120 | 4,500 Å | 4,850 Å |
| Example 4 | | 1.5 | | 1.5 | 80 | 4,200 Å | 4,600 Å |
| Comparative Example 11 | | | Irgacure 819 (370 nm) | 1.0 | 350 | Slit pattern lost | Transflective pattern lost |
| Comparative Example 12 | | | | 1.5 | 330 | Slit pattern lost | Transflective pattern lost |
| Example 5 | Irgacure 369 (325 nm) | 1.0 | | 1.0 | 250 | 4,300 Å | 4,550 Å |
| Example 6 | | 1.5 | | 1.5 | 180 | 4,100 Å | 4,250 Å |
| Comparative Example 13 | Irgacure OXE-02 (333 nm) | 1.0 | | | 100 | 2,400 Å | 2,850 Å |
| Comparative Example 14 | | 1.5 | | | 50 | 2,150 Å | 2,700 Å |
| Comparative Example 15 | | 1.0 | Irgacure 369 (325 nm) | 1.0 | 110 | 2,400 Å | 2,750 Å |
| Comparative Example 16 | | 1.5 | | 1.5 | 50 | 2,100 Å | 2,400 Å |
| Comparative Example 17 | | 1.0 | Irgacure 379 (326 nm) | 1.0 | 100 | 2,450 Å | 2,800 Å |

TABLE 1-continued

| Content (weight part) | Photoinitiator(s) | | | | Results | | |
|---|---|---|---|---|---|---|---|
| | Activation wavelength | Amount | Activation wavelength | Amount | Sensitivity (mJ/cm$^2$) | a*-b** | a-c*** |
| Comparative Example 18 | | 1.5 | | 1.5 | 50 | 2,100 Å | 2,400 Å |
| Comparative Example 19 | | 1.0 | Irgacure 651 (340 nm) | 1.0 | 100 | 2,400 Å | 2,750 Å |
| Comparative Example 20 | | 1.5 | | 1.5 | 50 | 2,050 Å | 2,500 Å |
| Example 7 | | 1.0 | Hexaaryl bisimidazole (270 nm) | 1.0 | 40 | 3,700 Å | 4,100 Å |
| Example 8 | | 1.5 | | 1.5 | 30 | 3,550 Å | 4,150 Å |
| Example 9 | | 1.0 | Irgacure 907 (305 nm) | 1.0 | 80 | 4,200 Å | 4,780 Å |
| Example 10 | | 1.5 | | 1.5 | 50 | 4,050 Å | 4,650 Å |
| Example 11 | | 1.0 | Irgacure 819 (370 nm) | 1.0 | 90 | 4,350 Å | 4,700 Å |
| Example 12 | | 1.5 | | 1.5 | 40 | 3,750 Å | 4,200 Å |

Note:
a*Pattern saturation thickness
b**Slit pattern thickness
c***Translfective pattern thickness As can be seen from Table 1 and FIGS. 1 and 2, when the single photoinitiator was used and the two photoinitiators having a difference in activation wavelength of less than 20 nm were used in combination in Comparative Examples 1-20, the values a-b and a-c were decreased with increasing sensitivity. In contrast, when the two photoinitiators having different activation wavelengths whose difference is at least 20 nm were used in combination in Examples 1-12, the values a-b and a-c remained high while maintaining the sensitivity constant.

INDUSTRIAL APPLICABILITY

As is apparent from the foregoing, the photoresist composition of the present invention has high sensitivity and forms a pattern whose thickness is easy to control depending on the exposure intensity through a slit or transflective mask. Therefore, the use of the photoresist composition according to the present invention is advantageous for the formation of column spacers, overcoats and passivation materials of liquid crystal display devices.

The invention claimed is:

1. A photoresist composition comprising two photoinitiators having different activation wavelengths whose difference is from 20 nm to 100 nm,
    wherein the two photoinitiators are present in a ratio of 1:3 to 3:1, and
    wherein the two photoinitiators are 2-benzyl-2-dimethylamino-1-(4-morpholinophenyl)-butan-1-one and hexaaryl bisimidazole;
        2-benzyl-2-dimethylamino-1-(4-morpholinophenyl)-butan-1-one and 2-methyl-1-[4-(methylthio)phenyl]-2-morpholinopropan-1-one;
        2-benzyl-2-dimethylamino-1-(4-morpholinophenyl)-butan-1-one and bis(2,4,6-trimethylbenzoyl)-phenylphosphineoxide;
        1-[9-ethyl-6-(2-methylbenzyl)-9H-carbazol-3-yl]ethanone-1-(O-acetyloxime) and 2-methyl-1-[4-(methylthio)phenyl]-2-morpholinopropan-1-one; or
        1-[9-ethyl-6-(2-methylbenzyl)-9H-carbazol-3-yl]ethanone-1-(O-acetyloxime) and bis(2,4,6-trimethylbenzoyl)-phenylphosphineoxide.

2. The photoresist composition of claim 1, wherein each of the photoinitiators has an activation wavelength ranging from 250 nm to 450 nm.

3. The photoresist composition of claim 1, wherein the photoresist composition comprises an alkali-soluble resin, an ethylenically unsaturated compound and a solvent, in addition to the photoinitiators.

4. The photoresist composition of claim 3, wherein the photoresist composition comprises 1 to 20% by weight of the alkali-soluble resin, 1 to 20% by weight of the ethylenically unsaturated compound, 0.05 to 10% by weight of the photoinitiators, and 50 to 90% by weight of the solvent.

5. The photoresist composition of claim 3, wherein the ethylenically unsaturated compound is selected from the compounds of Formulas 1 to 4:

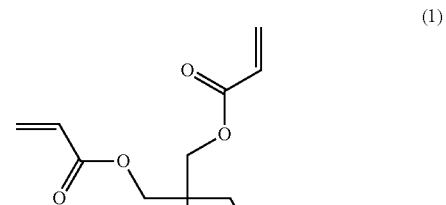

(1)

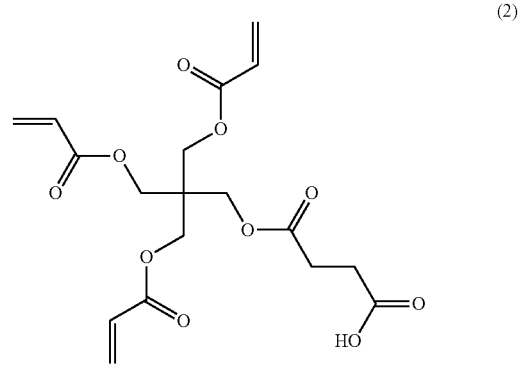

(2)

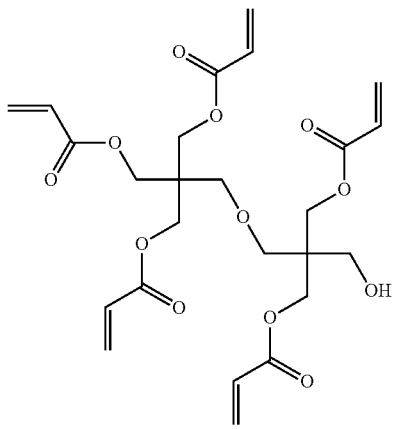

(3)

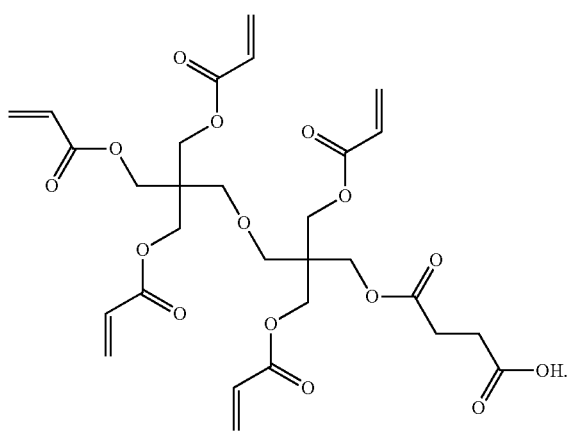

(4)

6. The photoresist composition of claim 3, wherein the solvent is selected from the group consisting of methyleth-ylketone, methyl cellosolve, propyl cellosolve, ethyl cellosolve, ethyleneglycol dimethylether, ethyleneglycol diethylether, ethyleneglycol methylethylether, propyleneglycol dimethylether, propyleneglycol diethylether, propyleneglycol methylethylether, 2-ethoxy propanol, 2-methoxy propanol, 3-methoxy butanol, cyclopentanone, cyclohexanone, propyleneglycol methyletheracetate, propyleneglycol ethyletheracetate, 3-methoxybutyl acetate, ethyl 3-ethoxypropionate, ethyl cellosolve acetate, methyl cellosolve acetate, butyl acetate, dipropyleneglycol monomethylether, and mixtures thereof.

7. The photoresist composition of claim 1, further comprising a curing accelerator, a thermal polymerization inhibitor, a plasticizer, an adhesion promoter, a filler, or a surfactant.

8. The photoresist composition of claim 7, wherein the curing accelerator is selected from the group consisting of 2-mercaptobenzoimidazole, 2-mercaptobenzothiazole, 2-mercaptobenzooxazole, 2,5-dimercapto-1,3,4-thiadiazole, and 2-mercapto-4,6-dimethylaminopyridine.

9. The photoresist composition of claim 7, wherein the thermal polymerization inhibitor is p-anisole or hydroquinone.

10. The photoresist composition of claim 1, wherein said photoinitiators have different activation wavelengths whose difference is from 20 nm to 70 nm.

11. A transparent thin film formed using the photoresist composition of claim 1.

12. The transparent thin film of claim 11, wherein a difference between a pattern saturation thickness and a slit pattern thickness of the transparent thin film is at least 3,500 Å.

13. The transparent thin film of claim 11, wherein a difference between a pattern saturation thickness and a transflective pattern thickness of the transparent thin film is at least 4,000 Å.

14. A liquid crystal display device comprising the transparent thin film of claim 11.

* * * * *